(12) United States Patent
Kräuter

(10) Patent No.: US 8,168,991 B2
(45) Date of Patent: May 1, 2012

(54) OPTICAL ELEMENT AND OPTOELECTRONIC COMPONENT COMPRISING SUCH AN OPTICAL ELEMENT

(75) Inventor: Gertrud Kräuter, Regensburg (FR)

(73) Assignee: OSRAM Opto Semiconductors GmbH, Regensburg (DE)

( * ) Notice: Subject to any disclaimer, the term of this patent is extended or adjusted under 35 U.S.C. 154(b) by 281 days.

(21) Appl. No.: 11/904,173

(22) Filed: Sep. 26, 2007

(65) Prior Publication Data

US 2008/0087908 A1 Apr. 17, 2008

(30) Foreign Application Priority Data

Sep. 27, 2006 (DE) .................. 10 2006 045 704

(51) Int. Cl.
*H01L 33/00* (2010.01)
(52) U.S. Cl. .......................... 257/98; 257/99
(58) Field of Classification Search .......... 257/98, 257/99, 680
See application file for complete search history.

(56) References Cited

U.S. PATENT DOCUMENTS

| | | | |
|---|---|---|---|
| 6,018,387 A | 1/2000 | Eppler et al. | |
| 6,411,439 B2 * | 6/2002 | Nishikawa | 359/619 |
| 6,504,301 B1 * | 1/2003 | Lowery | 313/512 |
| 7,031,070 B2 * | 4/2006 | Suzuki et al. | 359/642 |
| 7,070,300 B2 * | 7/2006 | Harbers et al. | 362/231 |
| 7,284,882 B2 * | 10/2007 | Burkholder | 362/294 |
| 7,345,317 B2 * | 3/2008 | Reeh et al. | 257/98 |
| 7,378,686 B2 * | 5/2008 | Beeson et al. | 257/100 |
| 7,581,860 B2 | 9/2009 | Bogner et al. | |
| 7,651,775 B2 * | 1/2010 | Suzuki et al. | 428/446 |
| 2002/0012250 A1 * | 1/2002 | Nestell et al. | 362/520 |
| 2003/0148041 A1 | 8/2003 | Bewig et al. | |
| 2004/0114339 A1 * | 6/2004 | Obi | 362/23 |
| 2004/0145312 A1 * | 7/2004 | Ouderkirk et al. | 313/512 |
| 2004/0184155 A1 | 9/2004 | Kornblit et al. | |
| 2005/0128600 A1 | 6/2005 | Suzuki et al. | |
| 2006/0050526 A1 * | 3/2006 | Ikeda et al. | 362/555 |
| 2006/0226523 A1 * | 10/2006 | Foust et al. | 257/680 |
| 2008/0087908 A1 | 4/2008 | Krauter | |

FOREIGN PATENT DOCUMENTS

| | | |
|---|---|---|
| CA | 2287055 | 5/2000 |
| DE | 197 04 731 | 8/1998 |
| DE | 101 61 469 | 7/2003 |
| DE | 10 2005 018 336 | 8/2006 |
| EP | 0 999 033 | 5/2000 |
| EP | 1 542 041 | 6/2005 |
| JP | 2003-306770 A1 | 10/2003 |
| JP | 2005-173326 A | 6/2005 |
| JP | 2005-225998 A | 8/2005 |
| JP | 2005-292184 A | 10/2005 |
| WO | WO 2006/06544 | 1/2006 |
| WO | WO 2006/089503 | 8/2006 |

* cited by examiner

Primary Examiner — Douglas Menz
(74) Attorney, Agent, or Firm — Cozen O'Connor

(57) ABSTRACT

An optical element (1) is specified comprising an optical body (2) containing a plastic material. The optical body (2) is completely encapsulated by a protective layer (3) containing a silicon oxide. An optoelectronic component comprising such an optical element is furthermore described.

15 Claims, 3 Drawing Sheets

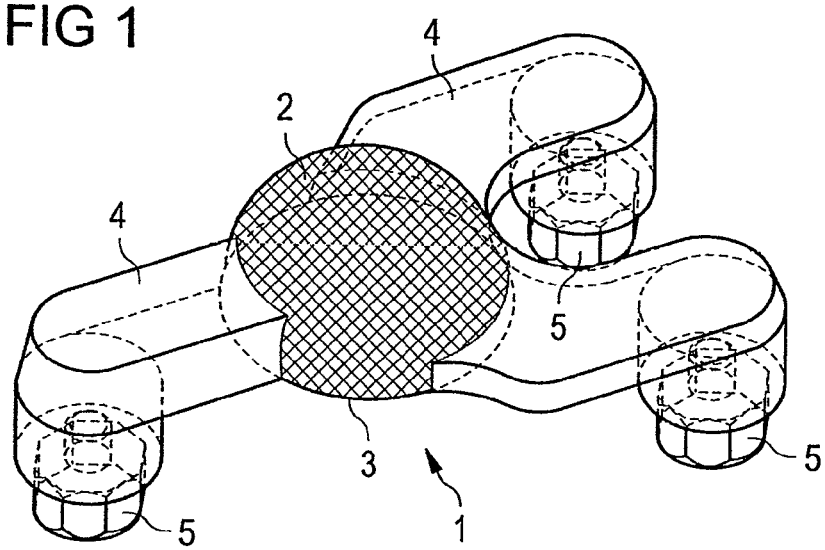
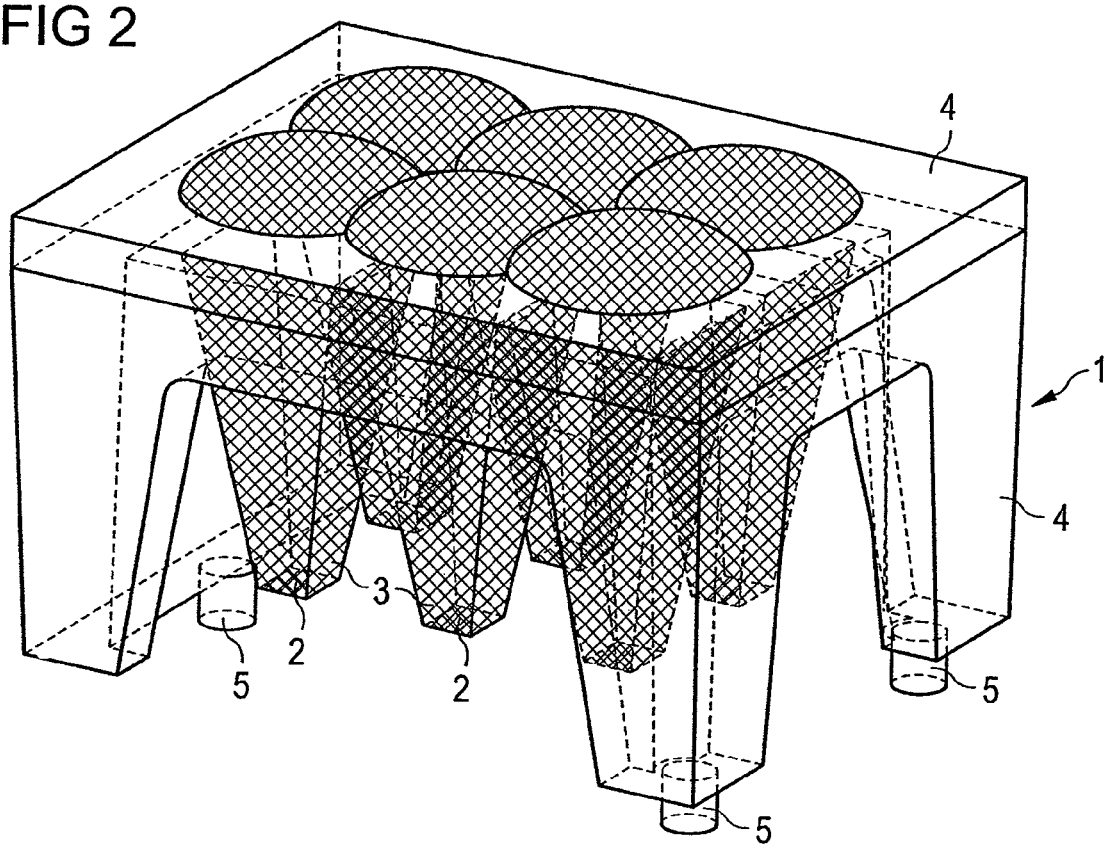

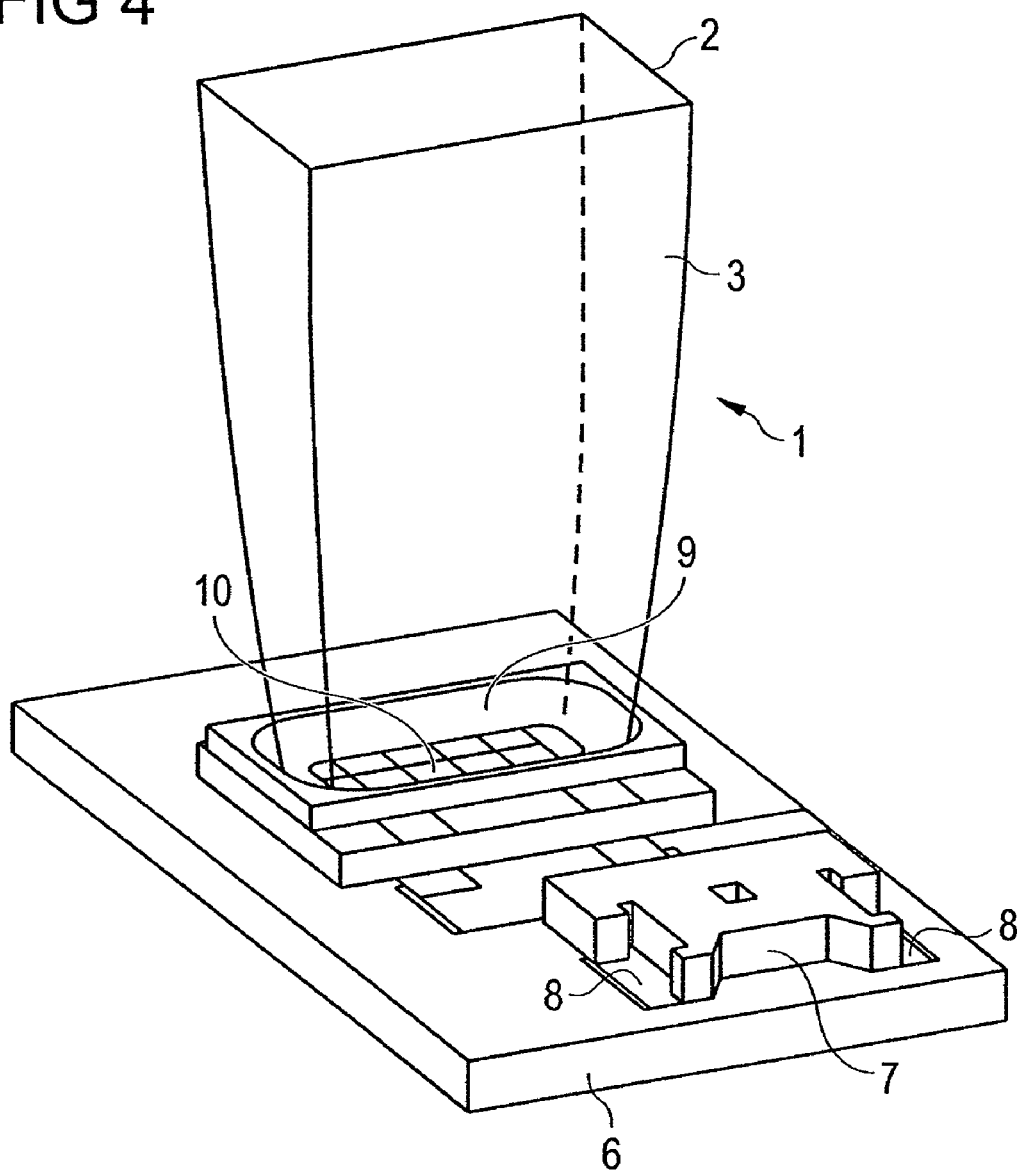

OPTICAL ELEMENT AND OPTOELECTRONIC COMPONENT COMPRISING SUCH AN OPTICAL ELEMENT

RELATED APPLICATIONS

This patent application claims the priority of German patent application 102006045704.8 filed Sep. 27, 2006, the disclosure content of which is hereby incorporated by reference.

FIELD OF THE INVENTION

An optical element is specified. An optoelectronic component comprising such an optical element is furthermore specified.

BACKGROUND OF THE INVENTION

The document DE 102005018336 describes an optoelectronic component comprising an optical element.

SUMMARY OF THE INVENTION

One object of the present invention is to provide an optical element having improved ageing properties. A further object is to provide an optical element which is particularly temperature-stable. Another object is to provide an optical element which can be produced particularly cost-effectively. A further object is to provide an optoelectronic component comprising such an optical element.

These and other objects are attained in accordance with an aspect of the present invention directed to an optical element comprising an optical body containing a plastic material, wherein the optical body is completely encapsulated by a protective layer containing a silicon oxide.

In accordance with at least one embodiment of the optical element, the optical element comprises an optical body. The optical body of the optical element forms the functional component of the optical element. That is to say that the optical body determines the optical properties of the optical element and is provided, for example, for optically manipulating electromagnetic radiation that passes through it or impinges on it. Besides the optical body, the optical element can comprise a holder, for example, which mechanically supports the optical body and holds it at a predetermined location.

In accordance with at least one embodiment of the optical element, the optical body contains a plastic material or comprises or consists of a plastic material. An optical body which contains a plastic material can be produced particularly simply and cost-effectively. By way of example, the optical body can be produced by means of an injection-molding method or a transfer-molding method.

In accordance with at least one embodiment, the surface of the optical body is provided with a protective layer at least in places. In particular, outer areas of the optical body which connect radiation passage areas of the optical body to one another are provided with the protective layer.

Preferably, the optical body is coated with the protective layer. Preferably, the entire surface of the optical body is provided with the protective layer. That is to say that the optical body is preferably completely encapsulated by the protective layer, such that all exposed outer areas of the optical body are completely covered by the protective layer. In this context, completely encapsulated also means that there are no freely accessible regions of the surface of the optical body which are free of the protective layer. In particular, then not only are radiation passage areas of the optical body covered with the protective layer, but for example also areas which connect the radiation passage areas to one another. It is therefore possible for the entire optical body to be encapsulated by the protective layer, such that there are no areas of the optical body which are not covered by the protective layer. Preferably, the protective layer is in this case applied directly to the optical body. That is to say that the protective layer is then applied for example directly to the plastic material which the optical body comprises or which the optical body consists of, without further materials being arranged between optical body and protective layer.

In accordance with at least one embodiment of the optical element, the protective layer contains a silicon oxide. This means that the protective layer contains an oxide of silicon. Preferably, the protective layer comprises or consists of a silicon oxide.

In accordance with at least one embodiment of the optical element, the optical element comprises an optical body containing a plastic material, wherein the optical body is completely encapsulated by a protective layer containing a silicon oxide. In this case, it is possible for not only the optical body but also other components of the optical element—for example a holder for the optical body—to be completely encapsulated with the protective layer. In the extreme case, the entire optical element can be completely encapsulated with the protective layer. The protective layer is then preferably applied directly to the optical body or the optical element.

In accordance with at least one embodiment of the optical element, the optical body comprises or consists of a thermoplastic material. Preferably, the entire optical element can then comprise or consists of the thermoplastic material. In this case, the optical element can be formed in one piece or in a plurality of pieces. By way of example, the plastic from which the optical body is formed or which the optical body contains is one of the following materials: PMMA (Polymethyl methacrylate), PMMI (Poly(N-methyl-methacrylimide)), PC (Polycarbonate), COC (Cyclic Olefin Copolymer), COP (Cyclic Olefin Polymer), high-temperature PC (Polycarbonate).

In accordance with at least one embodiment of the optical element, the protective layer with which the optical body is coated comprises or consists of silicon dioxide. On account of its good adhesion to the plastic of the optical body and its high chemical and physical stability, silicon dioxide is particularly well suited as material for the protective layer.

In accordance with at least one embodiment of the optical element, the protective layer has a thickness which is less than the wavelength of the electromagnetic radiation for whose optical influencing the optical body is provided. If the optical element is provided for example for being used in an optoelectronic component by virtue of the optical element being provided for the beam shaping of visible light of a specific wavelength or a specific wavelength range, then the thickness of the protective layer is preferably smaller than the wavelength of said light.

The protective layer preferably has a uniform thickness. In this case, the thickness preferably fluctuates by at most 10% around an average value of the thickness.

In accordance with at least one embodiment of the optical element, the thickness of the protective layer is at most 400 nm. The optical element is then particularly well suited to optically influencing visible light.

In accordance with at least one embodiment of the optical element, the protective layer is provided as a diffusion barrier against the penetration of moisture into the optical body. That is to say that the protective layer is suitable for inhibiting or even preventing the penetration of moisture into the optical body.

In accordance with at least one embodiment of the optical element, the protective layer is provided as a diffusion barrier against the penetration of atmospheric gases into the optical body. That is to say that the protective layer is suitable for inhibiting or even preventing the penetration of atmospheric gases into the optical body.

In accordance with at least one embodiment of the optical element, the protective layer improves the thermal stability of the optical body. This is achieved inter alia by virtue of the fact that the protective layer inhibits or prevents the penetration of moisture into the optical body. As a result, it is possible for the optical body to remain stable and mechanically fixed and to retain its form even at high temperatures of more than 100 degrees Celsius.

In accordance with at least one embodiment, the protective layer is applied to the optical body by means of a plasma enhanced coating method such as, for example, plasma enhanced chemical vapor deposition (PECVD). A plasma enhanced coating method is a method which is particularly mild in respect of material and in which a film having a uniform thickness can be applied to the optical body at relatively low coating temperatures.

In accordance with at least one embodiment of the optical element, the optical body of the optical element is suitable for optically influencing the electromagnetic radiation passing through it in at least one of the following ways: reflection, refraction, diffraction, transmission. The optical element can be for example a refraction lens, a diffraction lens, an optical waveguide or an optical concentrator.

An optoelectronic component is furthermore specified. In accordance with at least one embodiment of the optoelectronic component, the component comprises at least one optoelectronic semiconductor chip provided for generating radiation or detecting radiation. The semiconductor chip is for example a luminescence diode chip such as a laser diode chip or light emitting diode chip. Furthermore, the optoelectronic semiconductor chip can be a photodetector chip. Furthermore, it is possible for the optoelectronic semiconductor chip to be an organic light emitting diode (OLED).

Preferably at least one optical element as described in conjunction with one of the previous embodiments is disposed downstream of the optoelectronic semiconductor chip in such a way that at least part of the radiation generated or detected by the optoelectronic semiconductor chip during operation passes through the optical body of the optical element. Preferably, at least part of the electromagnetic radiation that has passed through is optically influenced in this case.

In accordance with at least one embodiment of the optoelectronic component, the optical body of the optical element is heated to a temperature of at least 120 degrees Celsius at least in places during the operation of the optoelectronic component. Such heating can occur for example on account of the waste heat of the optoelectronic semiconductor chip during the operation of the optoelectronic component. The optical element is suitable for permanently withstanding such temperature loading without damage in particular on account of the protective layer.

BRIEF DESCRIPTION OF THE DRAWINGS

FIG. 1 shows an optical element described here in a schematic perspective illustration in accordance with a first exemplary embodiment.

FIG. 2 shows an optical element described here in accordance with a second exemplary embodiment in a schematic perspective illustration.

FIG. 4 shows an optoelectronic component described here in accordance with one exemplary embodiment in a schematic perspective illustration.

DETAILED DESCRIPTION OF THE DRAWINGS

Figure 3A:
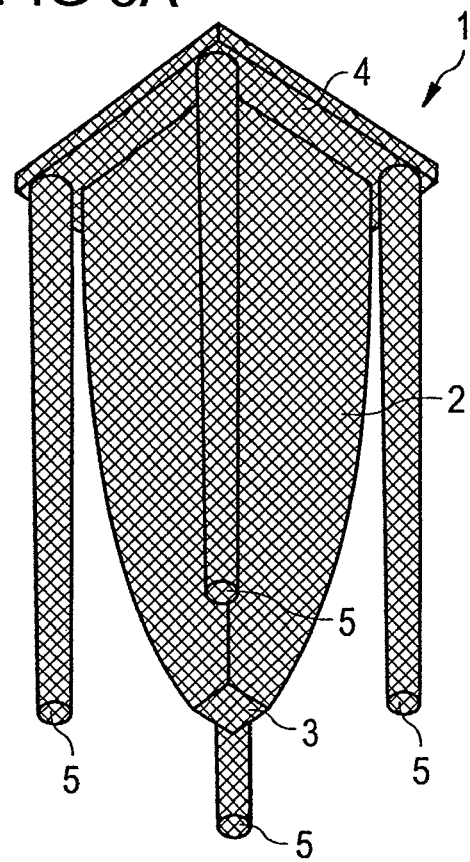
FIG. 3A shows an optical element in accordance with a third exemplary embodiment in a schematic perspective illustration.

In the exemplary embodiments and figures, identical or identically acting component parts are in each case provided with the same reference symbols. The elements illustrated should not be regarded as true to scale, rather individual elements may be illustrated with an exaggerated size in order to afford a better understanding.

FIG. 1 shows an optical element 1 described here in a schematic perspective illustration in accordance with a first exemplary embodiment. The optical element is a refraction lens. The optical element 1 comprises an optical body 2. The optical body 2 comprises or consists of a thermoplastic material. The optical body 2 forms a refraction lens. Holders 4 adjoin the optical body 2. The holders 4 comprise or consist of the same material as the optical body 2 and are preferably produced and formed in one piece with the latter. The holders 4 in each case comprise fitting pins 5 by means of which the optical element—for example by a press fit—can be mechanically fixed to a carrier.

At least the optical body 2 of the optical element 1 is coated with a protective layer 3. The protective layer 3 completely encapsulates the optical body 2. The protective layer 3 consists of silicon dioxide and is provided for protecting the optical body against moisture and atmospheric gases.

FIG. 2 shows an optical element 1 described here in accordance with a second exemplary embodiment in a schematic perspective illustration. The optical element 1 comprises a multiplicity of optical bodies 2. The optical bodies 2 form optical concentrators that are formed in the manner of truncated pyramids. Each optical concentrator is terminated by a curved light exit area serving as a lens. At least the optical bodies 2 of the optical element 1 are coated with a protective layer 3 consisting of silicon dioxide.

The optical bodies 2 are formed in one piece with the holder 4, which comprises fitting pins 5 for fixing the optical element 1 on a carrier. Holder 4 and optical bodies 2 are manufactured jointly for example by means of a single injection-molding or transfer-molding method.

FIG. 3A shows an optical element 1 in accordance with a third exemplary embodiment in a schematic perspective illustration.

Figure 3B:
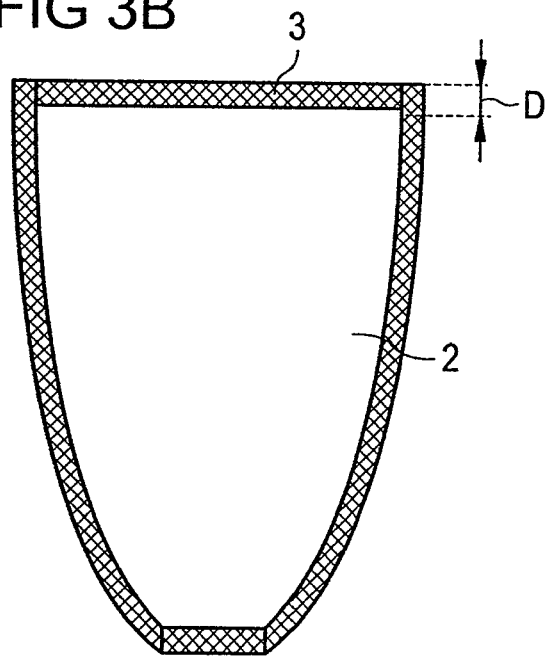
FIG. 3B shows the optical body of the optical element illustrated in FIG. 3A in a schematic sectional illustration.

FIG. 3B shows the optical body 2 of the optical element 1 illustrated in FIG. 3A in a schematic sectional illustration.

The optical element 1 comprises a holder 4 having fitting pins 5 with which the optical element 1 can be fixed mechanically to a carrier. The optical element 1 furthermore comprises an optical body 2. Optical body 2 and holder 4 can be formed in one piece or optical body 2 and holder 4 are manufactured separately from one another and subsequently brought together.

In the exemplary embodiment of FIG. 3A, the entire optical element, that is to say holder 4 and optical body 2, is coated with the protective layer 3 consisting of silicon dioxide.

The optical body 2 can also be formed, at least in places, in the manner of one of the following optical basic elements: compound parabolic concentrator (CPC), compound elliptic concentrator (CEC), compound hyperbolic concentrator (CHC). The lateral areas of the optical body are then formed, at least in places, in the manner of one of said optical basic elements. Furthermore, it is possible for the optical body to be shaped, at least in places, in the manner of a truncated cone or a truncated pyramid that tapers toward the light source.

As can be gathered from the sectional illustration of FIG. 3B, the protective layer 3 has a uniform thickness D, which is at most 400 nm. Preferably, the thickness D is at least 20 nm in this case. This ensures that the protective layer can realize its protection function.

FIG. 4 shows an optoelectronic component described here in accordance with one exemplary embodiment in a schematic perspective illustration. The optoelectronic component comprises a connection carrier 6. The connection carrier 6 is for example a metal-core circuitboard. Contact locations 8 are formed on the connection carrier 6, by means of which contact locations electrical contact can be made with the optoelectronic component externally. A plug connection 7 is provided for this purpose. Furthermore, the optoelectronic component comprises a ceramic carrier 9, onto which a plurality of light emitting diode chips 10 are arranged. An optical element 1 is disposed downstream of the light emitting diode chips 10 in the emission direction. The optical element 1 is completely encapsulated by a protective layer 3 consisting of silicon dioxide. The shape of optical element 1 can be as described in one of FIGS. 1, 2, 3A and 3B. The "shape" shown in FIG. 4 essentially illustrates the position where the optical element 1 is located, but the actual shape is as shown in one of the mentioned drawings.

The optical element 1 is heated at least in places, preferably completely, to temperatures of at least 120 degrees Celsius by the waste heat generated during the operation of the light emitting diode chips 10. On account of the protective layer 3, the optical body 2 is temperature-stable in such a way that softening and/or deformation of the optical body 2, as would be the case without protective layer 3, does not occur despite the heating.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

I claim:

1. An optical element comprising:
   an optical body containing a plastic material, and
   a holder which mechanically supports the optical body and holds it at a predetermined location, said holder consisting of the same material as the optical body,
   wherein the optical body and the holder are completely encapsulated by a protective layer containing a silicon oxide,
   wherein the holder comprises fitting pins for mechanically fixing the optical element, and
   wherein the fitting pins are capable of fixing the optical element on a carrier by a press fit.

2. The optical element as claimed in claim 1, in which the protective layer is applied directly to the optical body without further materials being situated between the optical body and the protective layer.

3. The optical element as claimed in claim 1, in which the optical body comprises a thermoplastic material.

4. The optical element as claimed in claim 1, in which the protective layer comprises a silicon dioxide.

5. The optical element as claimed in claim 1, in which the protective layer has a thickness which is less than a wavelength of an electromagnetic radiation for whose optical influencing the optical body is provided.

6. The optical element as claimed in claim 1, in which the protective layer has a thickness which is at most 400 nm.

7. The optical element as claimed in claim 1, in which the protective layer is provided as a diffusion barrier against penetration of moisture into the optical body.

8. The optical element as claimed in claim 1, in which the protective layer is provided as a diffusion barrier against penetration of atmospheric gases into the optical body.

9. The optical element as claimed in claim 1, in which the protective layer increases thermal stability of the optical body.

10. The optical element as claimed in claim 1, in which the protective layer is applied to the optical body by means of a plasma enhanced coating method.

11. The optical element as claimed in claim 1, in which the optical body optically influences an electromagnetic radiation passing through the optical body in at least one of the following ways: reflection, refraction, diffraction, and transmission.

12. An optoelectronic component comprising:
   at least one optoelectronic semiconductor chip provided for generating radiation or detecting radiation; and
   an optical element as claimed in claim 1,
   wherein the optical element is disposed completely downstream of the at least one optoelectronic semiconductor chip in such a way that at least part of an electromagnetic radiation generated or detected by the at least one optoelectronic semiconductor chip during operation passes through the optical body of the optical element.

13. The optoelectronic component as claimed in claim 12, in which the optical body is heated to a temperature of at least 120° Celsius during the operation of the component.

14. The optical element as claimed in claim 1, in which the protective layer consists of silicon dioxide.

15. An optical element comprising:
   a multiplicity of optical bodies comprising a plastic material, and
   a common holder which mechanically supports the optical bodies and holds them at a predetermined location, said common holder consists of the same material as the optical bodies,
   wherein at least the optical bodies are completely encapsulated by a protective layer containing a silicon oxide, and
   wherein the optical bodies and the holder are formed in one piece by at least one of a single injection-molding and a single transfer molding method.

* * * * *